(12) United States Patent
Cho

(10) Patent No.: US 9,303,840 B2
(45) Date of Patent: Apr. 5, 2016

(54) DISPLAY DEVICE

(71) Applicant: Samsung Display Co., Ltd., Yongin, Gyeonggi-do (KR)

(72) Inventor: Jong-Hwan Cho, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 76 days.

(21) Appl. No.: 14/142,713

(22) Filed: Dec. 27, 2013

(65) Prior Publication Data

US 2014/0192534 A1 Jul. 10, 2014

(30) Foreign Application Priority Data

Jan. 9, 2013 (KR) .................. 10-2013-0002639

(51) Int. Cl.
| | | |
|---|---|---|
| *F21V 5/00* | (2015.01) | |
| *H01L 51/52* | (2006.01) | |
| *G02F 1/1333* | (2006.01) | |
| *H01L 27/32* | (2006.01) | |

(52) U.S. Cl.
CPC ............ *F21V 5/002* (2013.01); *H01L 51/5253* (2013.01); *H01L 51/5275* (2013.01); *G02F 2001/13332* (2013.01); *H01L 27/3244* (2013.01)

(58) Field of Classification Search
CPC ..... F21V 5/002; H01L 27/32; H01L 27/3244; H01L 51/5253; H01L 51/5275; G02F 2001/13332; G02F 1/133606; G02B 6/005; G02B 6/0051; G02B 6/0053
See application file for complete search history.

(56) References Cited

U.S. PATENT DOCUMENTS

| | | | | |
|---|---|---|---|---|
| 2003/0017297 | A1* | 1/2003 | Song et al. ....................... | 428/68 |
| 2006/0290253 | A1* | 12/2006 | Yeo et al. ....................... | 313/116 |
| 2007/0081111 | A1* | 4/2007 | Chang .................. | G02B 6/0055 349/62 |
| 2009/0086506 | A1* | 4/2009 | Okumura ............. | G02B 6/0041 362/613 |
| 2009/0296422 | A1* | 12/2009 | Lee et al. ....................... | 362/558 |
| 2011/0042678 | A1* | 2/2011 | Kim et al. ....................... | 257/72 |
| 2011/0051046 | A1* | 3/2011 | Kim .......................... | G02B 5/02 349/65 |
| 2011/0147789 | A1* | 6/2011 | Lee et al. ....................... | 257/100 |
| 2012/0033155 | A1* | 2/2012 | Asano .................. | G02B 5/3033 349/62 |
| 2012/0256202 | A1* | 10/2012 | Lee et al. ........................ | 257/88 |

FOREIGN PATENT DOCUMENTS

| | | |
|---|---|---|
| KR | 10-2006-0040456 B1 | 5/2006 |
| KR | 10-2009-0126597 A | 12/2009 |
| KR | 10-2011-0105751 B1 | 9/2011 |

* cited by examiner

*Primary Examiner* — Bao Q Truong
(74) *Attorney, Agent, or Firm* — Lewis Roca Rothgerber Christie LLP

(57) ABSTRACT

A display device includes: a display panel; a resin layer on the display panel and having a first protrusion having a first style on a surface thereof; a first window on the resin layer and having a second protrusion having a second style on a surface thereof; and a second window on the first window.

12 Claims, 8 Drawing Sheets

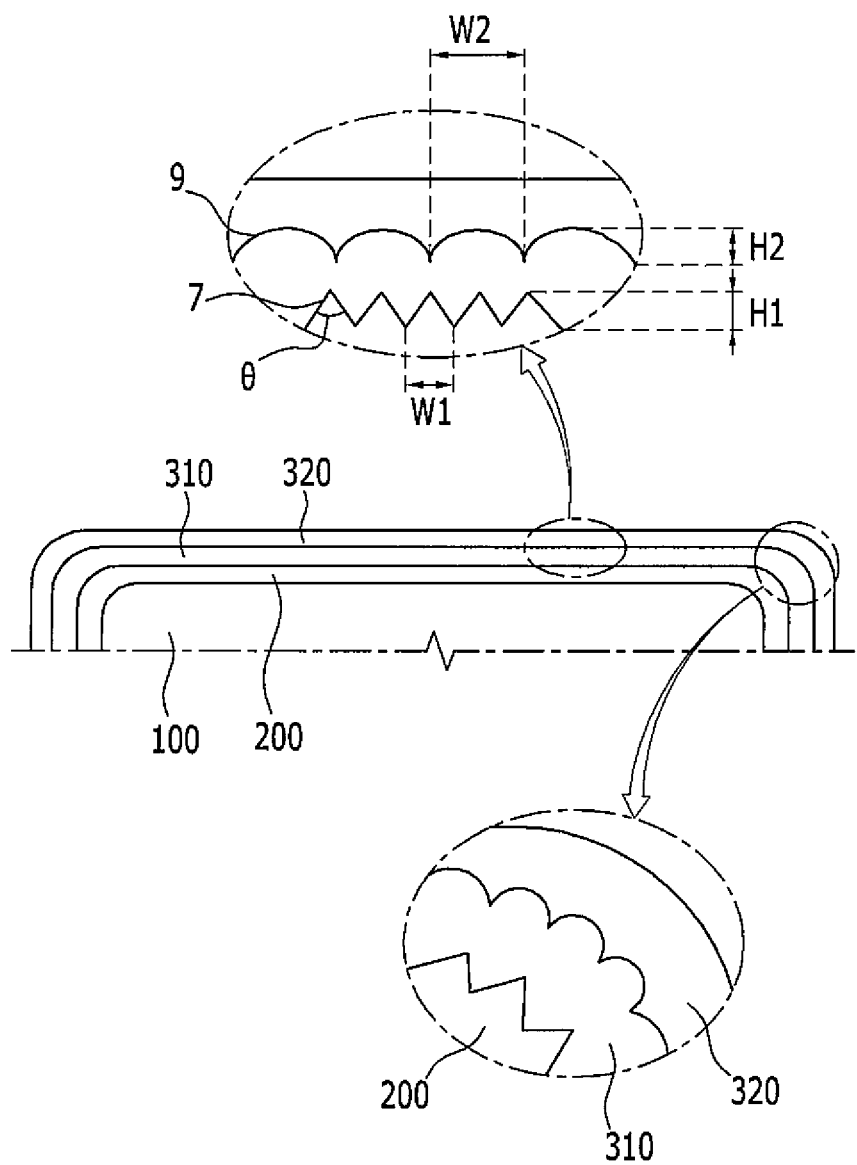

DISPLAY DEVICE

CROSS-REFERENCE TO RELATED PATENT APPLICATION

This application claims priority to and the benefit of Korean Patent Application No. 10-2013-0002639 filed in the Korean Intellectual Property Office on Jan. 9, 2013, the entire contents of which are incorporated herein by reference.

BACKGROUND

1. Field

The described technology relates generally to an organic light emitting diode (OLED) display.

2. Description of the Related Art

A display device is a device capable of displaying images, and recently, a display device including an organic light emitting diode has received attention.

Because the organic light emitting diode has a self-emission characteristic and does not require a separate light source, unlike a liquid crystal display device, the thickness and a weight of the entire display device may be reduced to improve a flexible characteristic of the display device. Further, the organic light emitting diode has high-quality characteristics such as low power consumption, high luminance, and a high response speed.

In general, the display device includes a display panel for displaying images, an optical unit positioned on the display panel and including a polarizing plate, and a window positioned on the optical unit and for protecting the optical unit.

The window includes particulates so as to improve luminance uniformity and front luminance, which allows luminance uniformity in the front direction, but does not guarantee high luminance uniformity in the curved inclination direction, which may lead to deteriorated image quality caused by moiré and sparkling.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide an organic light emitting diode (OLED) display for increasing a viewing angle while controlling or reducing luminance deterioration by preventing or reducing moiré and sparkling phenomena.

An exemplary embodiment provides a display device including: a display panel; a resin layer on the display panel and having a first protrusion having a first style on a surface thereof; a first window on the resin layer and having a second protrusion having a second style on a surface thereof; and a second window on the first window.

The resin layer, the first window, and the second window may include a first area for displaying an image, a second area that is curved and around the first area, and a third area at a side of the display panel.

A cross-section of the first style may be generally triangular, and a cross-section of the second style may be generally semi-circular.

The first protrusion may be at the first area, and the resin layer may further include a third protrusion having the second style at the second area.

A height and a width of the first protrusion may be in a range of 10 micrometers (μm) to 30 μm, and a height and a width of the second protrusion may be in a range of 1 μm to 100 μm.

Refractive indexes of the resin layer and the first window may be different from each other.

The resin layer may further include scattered particles.

The resin layer may include one or more layers including at least one of polycarbonate (PC), polymethylmethacrylate (PMMA), cyclic olefin polymer (COP), polyarylate (PAR), polyethersulfone (PES), polyethylene terephthalate (PET), and polyethylene naphthalate (PEN).

The first window may include one or more layers including at least one of polycarbonate (PC), polymethylmethacrylate (PMMA), polyarylate (PAR), polyethersulfone (PES), polyethylene terephthalate (PET), and polyethylene naphthalate (PEN), and the second window may include glass or silplus.

The display panel may include an organic light emitting element.

According to an embodiment, when the display device including a window with protrusions and depressions is formed, the moiré and sparkling phenomena are prevented or substantially prevented (e.g., reduced) and the luminance deterioration is controlled or reduced to improve the viewing angle.

BRIEF DESCRIPTION OF THE DRAWINGS

FIG. 1A and FIG. 1B shows a cross-sectional view of an organic light emitting diode (OLED) display according to an exemplary embodiment.

DETAILED DESCRIPTION

Figure 1B:
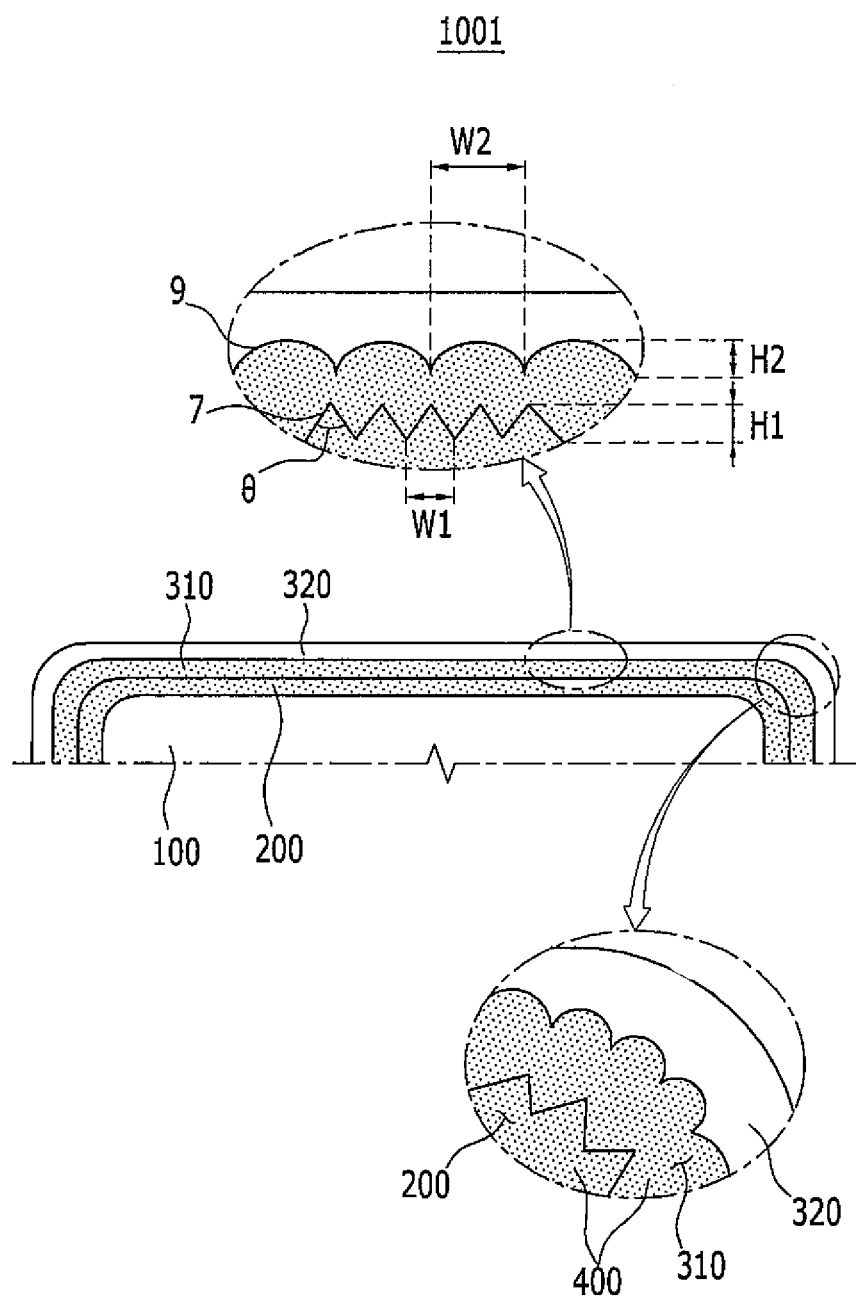

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, the size and thickness of each configuration shown in the drawings are arbitrarily shown for understanding and ease of description, but the present invention is not limited thereto.

In the drawings, the thickness of layers, films, panels, regions, etc., are exaggerated for clarity. For understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements.

The word "on" will be understood to be positioned above or below a target element and will not necessarily be understood to be positioned at an upper side based on a gravity direction.

An optical unit according to an exemplary embodiment will now be described with reference to accompanying drawings.

FIG. 1A and FIG. 1B shows a cross-sectional view of an organic light emitting diode (OLED) display according to an exemplary embodiment.

As shown in FIG. 1A, the organic light emitting diode (OLED) display 1001 includes a display panel 100, a resin layer 200 provided on the display panel 100, a first window 310 provided on the resin layer 200, and a second window 320 provided on the first window 310.

The display panel 100 includes a plurality of pixels including organic light emitting elements for displaying an image, and it is flexible.

An internal configuration of a display panel 100 according to an exemplary embodiment will now be described with reference to FIG. 2 and FIG. 3.

Figure 2:
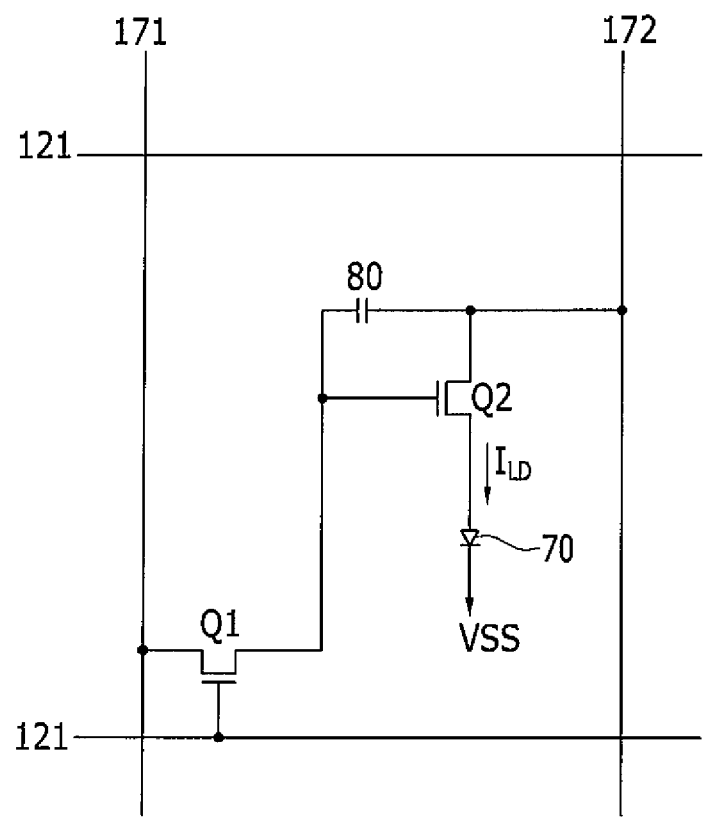
FIG. 2 shows an equivalent circuit diagram of a pixel of a display panel according to an exemplary embodiment.
Figure 3:
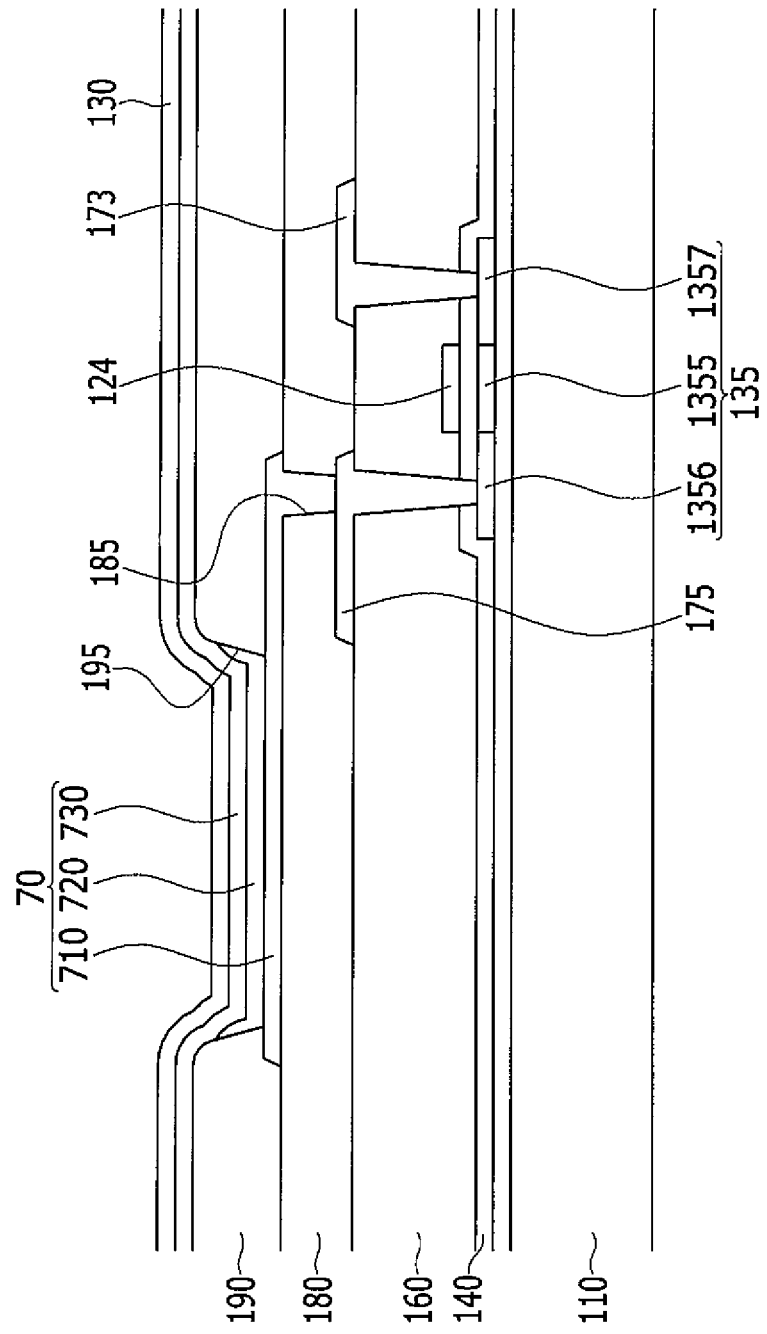
FIG. 3 shows a cross-sectional view of the pixel shown in FIG. 2.

FIG. 2 shows an equivalent circuit diagram of a pixel of a display panel according to an exemplary embodiment, and FIG. 3 shows a cross-sectional view of the pixel shown in FIG. 2.

A detailed configuration of a pixel of the display panel is shown in FIG. 2 and FIG. 3, and the exemplary embodiment is not restricted to the configuration shown in FIG. 2 and FIG. 3. A wire (e.g., electrical circuit for an OLED) and an organic light emitting element can be configured in various ways within a range of modification by a person skilled in the art. For example, a 2Tr-1 Cap active matrix (AM) type of display device having two thin film transistors (TFTs) and a capacitor for each pixel is shown for the display device in the drawing, but the embodiment is not limited thereto. The display device does not limit the number of thin film transistors, capacitors, and wires. The pixel represents a minimum unit for displaying the image, and the display device uses a plurality of pixels to display the image.

FIG. 3 shows a thin film transistor coupled to the organic light emitting element.

As shown in FIG. 2 and FIG. 3, the display panel 100 includes a first thin film transistor Q1, a second thin film transistor Q2, a capacitor 80, and an organic light emitting element 70 for each pixel. The first thin film transistor Q1, the second thin film transistor Q2, and the capacitor 80 constitute a portion of the electrical circuit of a pixel. The electrical circuit of the pixel further includes a gate line 121 positioned to extend across one direction of the substrate 10, a data line 171 crossing the gate line 121 in an insulated manner and positioned to extend across another direction of the substrate 10, and a constant voltage line 172. One pixel may be defined by a boundary of the gate line 121, the data line 171, and the constant voltage line 172, but the embodiment is not limited thereto.

As shown, for example, in FIG. 3, the organic light emitting element 70 includes a first electrode 710, an organic emission layer 720 formed on (e.g., located or positioned at) the first electrode 710, and a second electrode 730 formed on the organic emission layer 720.

The organic emission layer 720 is formed in (e.g., located or positioned at) an opening 195 that extends through a pixel definition layer 190.

The first electrode 710 may operate as an anode, which is a hole injection electrode, and the second electrode 730 may operate as a cathode, which is an electron injection electrode. However, the exemplary embodiment is not restricted thereto, and the first electrode 710 can be a cathode and the second electrode 730 can be an anode according to a method for driving a display device. Holes and electrons are injected into the organic emission layer 720 from the first electrode 710 and the second electrode 730, respectively. The organic emission layer 720 emits light as exitons, which are a combination of the holes and the electrons injected inside the organic emission layer 720, are changed to a ground state from an exited state. The first electrode 710 is formed with a light reflection configuration, and the second electrode 730 is formed with a light transmission configuration. That is the first electrode 710 is configured to reflect light, and the second electrode 730 is configured to allow light to be transmitted through the second electrode 730. Therefore, the organic light emitting element 10 emits light in a window direction of FIG. 1A.

The capacitor 80 includes a pair of capacitor electrodes and a dielectric material provided between the electrodes. Capacitance of the capacitor 80 is determined by the charge stored in the capacitor 80 and a voltage between the capacitor electrodes. The capacitor electrodes are formed with a conducting material, such as the conductive material of a gate electrode 124, a source electrode 173, and a drain electrode 175, or a first electrode 710. The dielectric material is an insulation material provided between the capacitor electrodes, and for example, it can be the same as or similar to the insulation material of a gate insulating layer 140 or interlayer insulating layers 160 and 180.

The first thin film transistor Q1 is used as a switch for selecting a pixel to emit light. A gate electrode of the first thin film transistor Q1 is coupled to the gate line 121, a source electrode is coupled to the data line 171, and a drain electrode is coupled to a gate electrode 124 of the second thin film transistor Q2.

As shown in FIG. 3, the second thin film transistor Q2 includes a semiconductor 135, a gate electrode 124, a source electrode 173, and a drain electrode 174. The semiconductor 135 includes a source region 1357, drain region 1356, and a channel region 1355. The first thin film transistor Q1 also includes a semiconductor, a gate electrode, a source electrode, and a drain electrode.

The second thin film transistor Q2 applies a drive power for emitting the organic emission layer 720 of the organic light emitting element 70 in the selected pixel to the first electrode 710. A gate electrode 124 of the second thin film transistor Q2 is coupled to a drain electrode of the first thin film transistor, a source electrode 173 is coupled to a constant voltage line 172, and a drain electrode 175 is coupled to a first electrode 710 of the organic light emitting element 70 by way of a conductive material in (e.g., deposited or formed in) a contact hole 185.

Therefore, the organic light emitting element 70 controls intensity and emits light according to an output current (ILD) of the second thin film transistor Q2 to display an image.

An encapsulation member 130 is formed on the second electrode 730. The encapsulation member 130 may include a plurality of layers, such as at least one of an inorganic layer, or an organic layer, which are alternately and repeatedly stacked. The inorganic layer includes aluminum oxide or silicon oxide, and the organic layer includes epoxy, acrylate, or urethane acrylate.

The inorganic layer prevents external moisture and oxygen from permeating into the light emitting element. The organic layer alleviates internal stress of the inorganic layer, or it fills fine cracks and pinholes of the inorganic layer. Materials of the inorganic layer and the organic layer described above are examples, the embodiment is not restricted to the described materials, and various kinds of inorganic layers and organic layers are usable by the person skilled in the art.

The encapsulation member 130 covers or substantially covers the pixel to control or reduce its exposure to external elements.

Referring to FIG. 1A, the resin layer 200 includes at least one of polymer materials such as polycarbonate (PC), polymethylmethacrylate (PMMA), cyclic olefin polymer (COP), polyarylate (PAR), polyethersulfone (PES), polyethylene terephthalate (PET), or polyethylene naphthalate (PEN), and it is formed with a single layer or multilayers.

A first protrusion 7 (labeled, e.g., in FIG. 4) is formed or located on a surface of the resin layer 200 opposite the display panel 100. The first protrusion 7 is integrally formed with the resin layer 200.

The first protrusion 7 may have a generally polygonal pyramid shape such as a triangular pyramid or a quadrangular pyramid, with a cross-section that is generally triangular, and an angle (Θ) between two oblique or adjacent edges of the triangle that is in a range of 30° to 90°. The width (W1) and height (H1) of the first protrusion 7 are in a range of 10 micrometers (μm) to 30 μm.

A second protrusion 9 (labeled, e.g., in FIG. 4) is formed on the surface of the first window 310 opposite the resin layer 200. The second protrusion 9 is integrally formed with the second window 320. The second protrusion 9 may have a generally hemispherical (e.g., generally semi-spherical) shape with a cross-section that is generally circular or oval.

The first window 310 includes at least one of polycarbonate (PC), polymethylmethacrylate (PMMA), polyarylate (PAR), polyethersulfone (PES), polyethylene terephthalate (PET), and polyethylene naphthalate (PEN), and it is formed as a single layer or as multiple layers.

The width (W2) and the height (H2) of the second protrusion 9 are in a range of 1 μm to 100 μm.

The second window 320 is made of glass or silplus, it is provided to the outermost part, and it protects or substantially protects the display panel from external scratches and impacts.

When the first protrusion 7 and the second protrusion 9 are formed as described, light is refracted by a prism effect caused by the first protrusion 7, and the refracted light is transmitted to the second protrusion 9, which will be described in detail with reference to FIG. 4 and FIG. 5.

Figure 4:
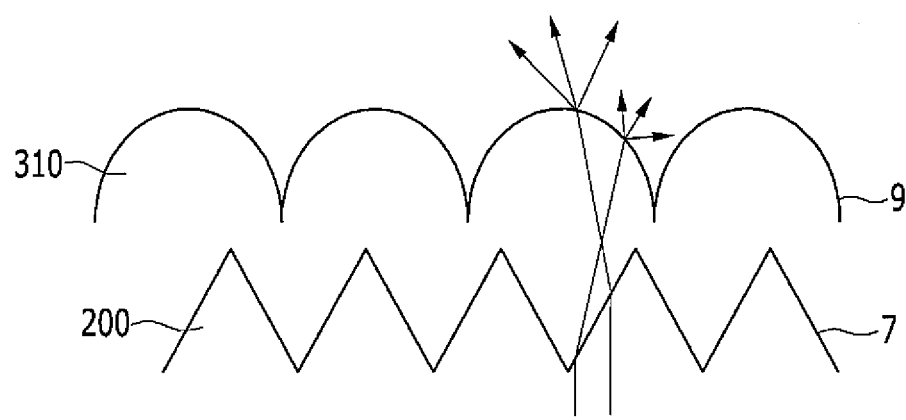
FIG. 4 and FIG. 5 show an effect according to an exemplary embodiment.
Figure 5:
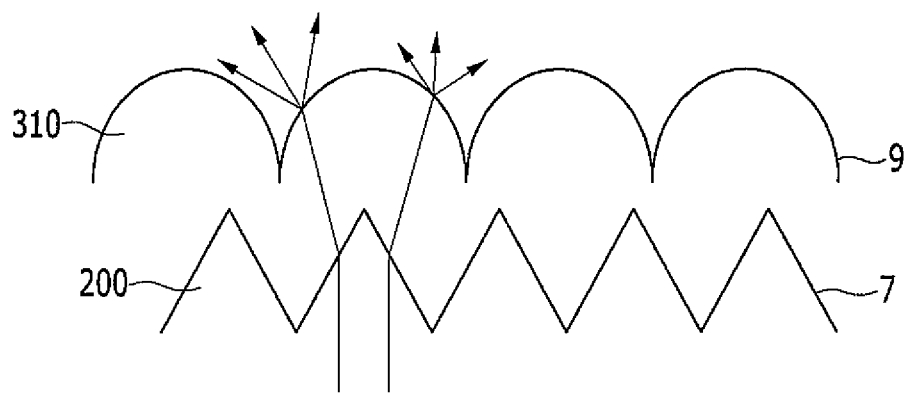

FIG. 4 and FIG. 5 show an effect according to an exemplary embodiment.

The resin layer 200 and the first window 310 can have different refractive indexes so as to maximize or increase the light that is transmitted to the second protrusion 9. That is, when the refractive indexes of the resin layer 200 and the first window 310 are n1 and n2, respectively, they have the relation of n1>n2 or n1<n2. The light is refracted on the boundary of materials that have different refractive indexes so when the resin layer 200 and the first window 310 have the relation of n1<n2, the light is refracted in the converging direction (acute angle) on the boundary of the resin layer 200 and the first window 310 as shown in FIG. 4, and when they have the relation of n1>n2, the light is refracted in the diverging direction (obtuse angle) on the boundary of the resin layer 200 and the first window 310 as shown in FIG. 5.

The light gathered by the first protrusion 7 is provided or transmitted to the second protrusion 9, and the light provided to the second protrusion 9 is scattered by the second protrusion 9 and is then output to the outside so luminance of the display device is maintained uniformly.

When the protrusion is not formed, a moiré pattern and a sparkling phenomenon may be generated. However, when the protrusion is formed according to the exemplary embodiment, distortion and double refraction of light can be minimized to uniformly control luminance of the display device.

As shown, for example, in FIG. 1B. The resin layer 200 and the first window 310 can further include scattered particles 400. The scattered particles 400 have a size or cross-sectional width in a range of several nanometers to several hundred nanometers, and they are formed with inorganic particles such as silicon oxide, aluminum oxide, titanium oxide, or zirconium oxide, or organic particles such as methyl methacrylate, acrylic acid, methacrylic acid, or hydroxy ethyl methacrylate.

The scattered particles 400 scatter the light that is input to the resin layer 200 or the first window 310 so that uniform light may be transmitted to the first protrusion 7 or the first window 310.

Figure 6:
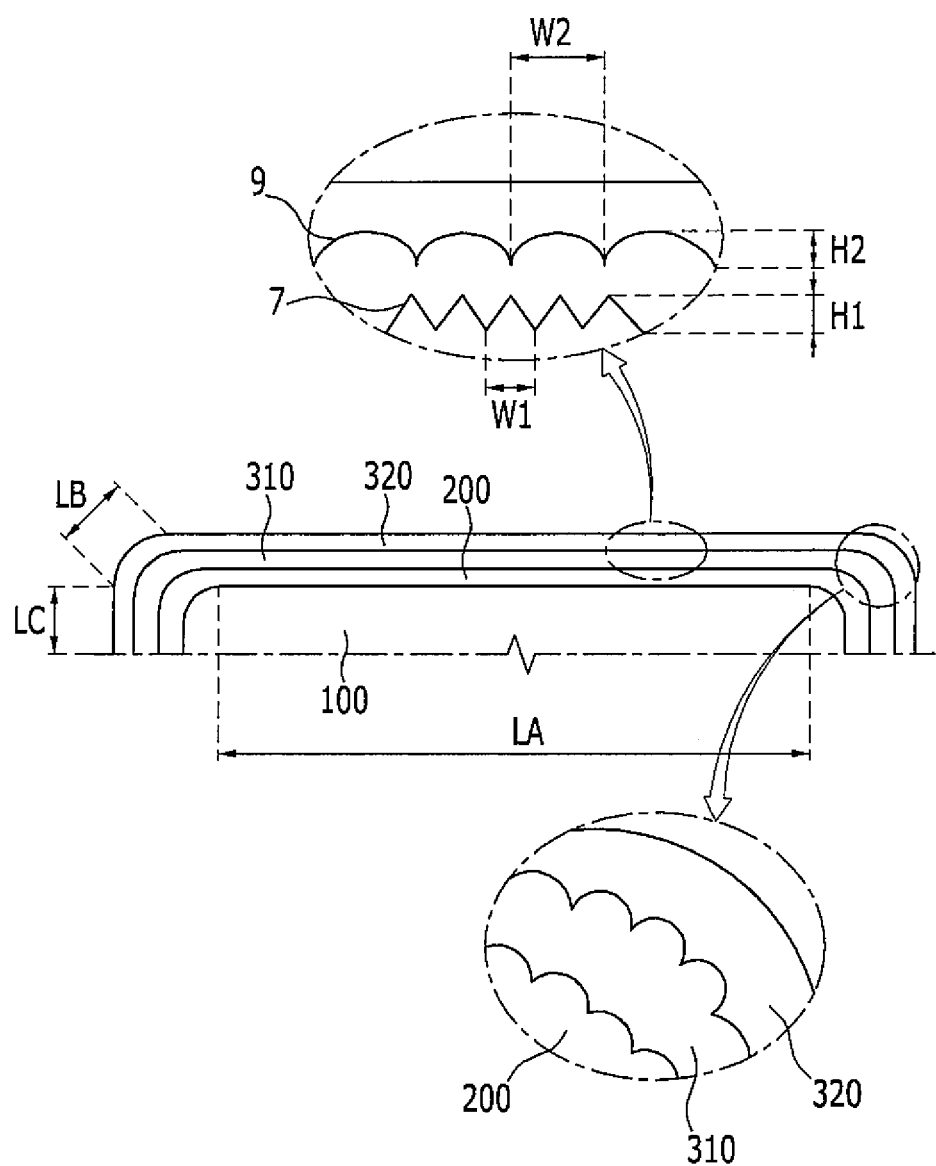
FIG. 6 and FIG. 7 show cross-sectional views of an organic light emitting diode (OLED) display according to another exemplary embodiment.

FIG. 6 shows a cross-sectional view of an organic light emitting diode (OLED) display according to another exemplary embodiment.

As shown in FIG. 6, the second protrusion, not the first protrusion, is formed on the curve of the window.

Most of the configuration corresponds to that of FIG. 1 so different parts will be described in detail.

As shown in FIG. 6, the organic light emitting diode (OLED) display 1002 includes a display panel 100, a resin layer 200 provided on the display panel, a first window 310 provided on the resin layer 200, and a second window 320 provided on the first window 310.

The resin layer 200, the first window 310, and the second window 320 include a first area (LA) that is flat or substantially flat, a second area (LB) that substantially surrounds (e.g., is located around a perimeter of) the first area (LA) and is bent with a curvature (e.g., a predetermined curvature), and a third area (LC) coupled to the second area (LB) that may be perpendicular or substantially perpendicular with respect to the first area (LA).

The first area (LA) displays an image of the display device, the second area (LB) is curved to wrap an edge of the display device, and the third area (LC) corresponds to a side of the display device.

A first protrusion 7 is formed in the first area (LA) to the third area (LC) in the exemplary embodiment of FIG. 1A, and a second protrusion 9, which is different from the first protrusion 7, is formed in the second area (LB) and the third area (LC) in the exemplary embodiment of FIG. 6. That is, at the second area (LB) and the third area (LC), the second protrusion 9 is formed on the surface of the resin layer 200 that is adjacent to the first window 310, instead of the first protrusion 7.

The first protrusion 7 gathers light, so it may be desirable to form the second protrusion 9 that scatters light in the second area (LB) and the third area (LC) which are non-display areas. When the light is gathered by the first protrusion 7, the first protrusion 7 becomes brighter than the first area (LA) that displays the image, so it may be desirable to scatter the light by using the second protrusion 9 to maintain uniformity of the luminance.

Figure 7:
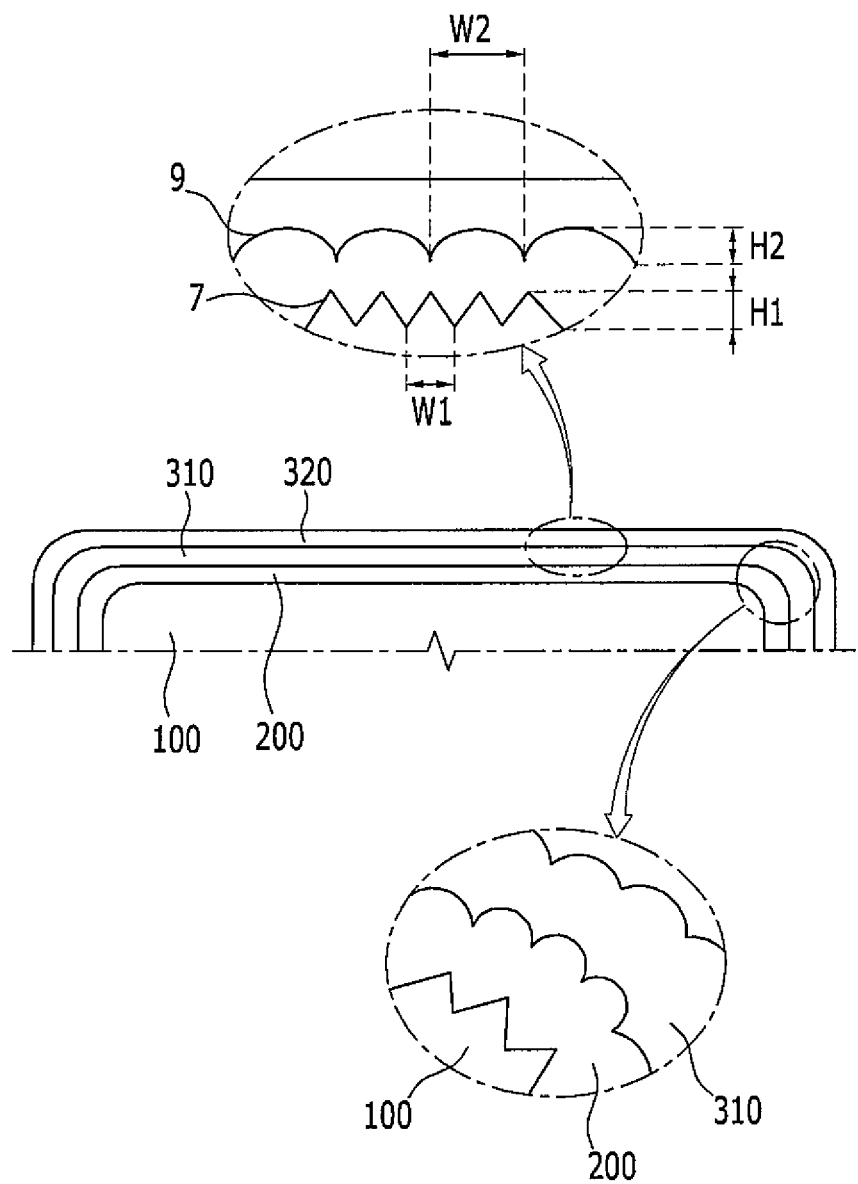

It has been exemplified in the exemplary embodiment that the first protrusion 7 and the second protrusion 9 are formed on the resin layer 200 and the first window 310, and as shown in FIG. 7, the first protrusion 7 or the second protrusion 9 can also be formed on the outermost layer of the display panel 100 (e.g., the surface of the display panel 100 facing the resin layer 200).

In this instance, the outermost layer of the display panel 100 can be an encapsulation member or material. A protrusion is formed on the encapsulation member by using a photolithography process.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and their equivalents.

What is claimed is:

1. A display device comprising:
a display panel;
a resin layer on a display surface of the display panel and having a first protrusion having a first style on a surface thereof;
a first window on the resin layer and having a second protrusion having a second style on a surface thereof; and
a second window on the first window.

2. The display device of claim 1, wherein
the resin layer, the first window, and the second window comprise a first area for displaying an image, a second area that is curved and around the first area, and a third area at a side of the display panel.

3. The display device of claim 2, wherein
a cross-section of the first style is generally triangular, and a cross-section of the second style is generally semi-circular.

4. The display device of claim 3, wherein
the first protrusion is at the first area.

5. The display device of claim 4, wherein
the resin layer further comprises a third protrusion having the second style at the second area.

6. The display device of claim 3, wherein
a height and a width of the first protrusion are in a range of 10 micrometers (μm) to 30 μm.

7. The display device of claim 3, wherein
a height and a width of the second protrusion are in a range of 1 micrometer (μm) to 100 μm.

8. The display device of claim 1, wherein
refractive indexes of the resin layer and the first window are different from each other.

9. The display device of claim 1, wherein
the resin layer further comprises scattered particles.

10. The display device of claim 1, wherein
the resin layer comprises one or more layers comprising at least one of polycarbonate (PC), polymethylmethacrylate (PMMA), cyclic olefin polymer (COP), polyarylate (PAR), polyethersulfone (PBS), polyethylene terephthalate (PET), and polyethylene naphthalate (PEN).

11. The display device of claim 1, wherein
the first window comprises one or more layers comprising at least one of polycarbonate (PC), polymethylmethacrylate (PMMA), polyarylate (PAR), polyethersulfone (PES), polyethylene terephthalate (PET), and polyethylene naphthalate (PEN), and
the second window comprises glass or silplus.

12. The display device of claim 1, wherein
the display panel comprises an organic light emitting element.

* * * * *